United States Patent
Takizawa

(10) Patent No.: US 7,211,865 B2
(45) Date of Patent: May 1, 2007

(54) SILICIDED BODY CONTACT SOI DEVICE

(75) Inventor: Teruo Takizawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/074,362

(22) Filed: Mar. 7, 2005

(65) Prior Publication Data
US 2005/0205925 A1    Sep. 22, 2005

(30) Foreign Application Priority Data
Mar. 22, 2004   (JP)   ............... 2004-082544

(51) Int. Cl.
*H01L 27/12* (2006.01)
(52) U.S. Cl. .............. 257/347; 257/327; 257/476; 257/E29.043; 438/149; 438/151; 438/167
(58) Field of Classification Search .......... 257/349, 257/354, 347
See application file for complete search history.

(56) References Cited
U.S. PATENT DOCUMENTS 5,930,605 A * 7/1999 Mistry et al. ............... 438/149
6,154,091 A * 11/2000 Pennings et al. ........... 327/565
6,383,850 B2 * 5/2002 Hirano ....................... 438/152
6,603,175 B2 8/2003 Kadowaki et al.
2002/0125534 A1 * 9/2002 Kim et al. .................. 257/347
2003/0222308 A1 * 12/2003 Su et al. ..................... 257/347
2005/0250263 A1 * 11/2005 Liu et al. .................... 438/151

FOREIGN PATENT DOCUMENTS

JP    2002-111005    4/2002
JP    2003-282876    10/2003

* cited by examiner

*Primary Examiner*—Jerome Jackson
*Assistant Examiner*—Paul Budd
(74) *Attorney, Agent, or Firm*—Harness, Dickey & Pierce, P.L.C.

(57) ABSTRACT

A semiconductor device includes a dielectric layer, a semiconductor layer provided above the dielectric layer, a gate dielectric layer provided above the semiconductor layer, a gate electrode provided above the gate dielectric layer, a source region and a drain region provided in the semiconductor layer, a body region other than the source region and the drain region in the semiconductor layer, and a body contact region that divides the source region in a plurality of areas and joins to the body region, wherein the body contact region is formed of a compound of a semiconductor of the semiconductor layer and a metal.

6 Claims, 11 Drawing Sheets

FIG. 9 (A) (PRIOR ART)
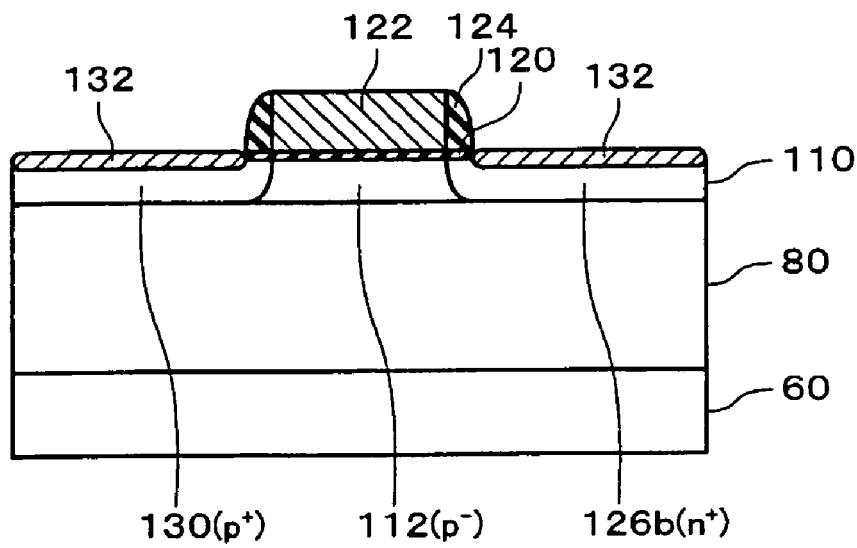
FIG. 9 (B) (PRIOR ART)
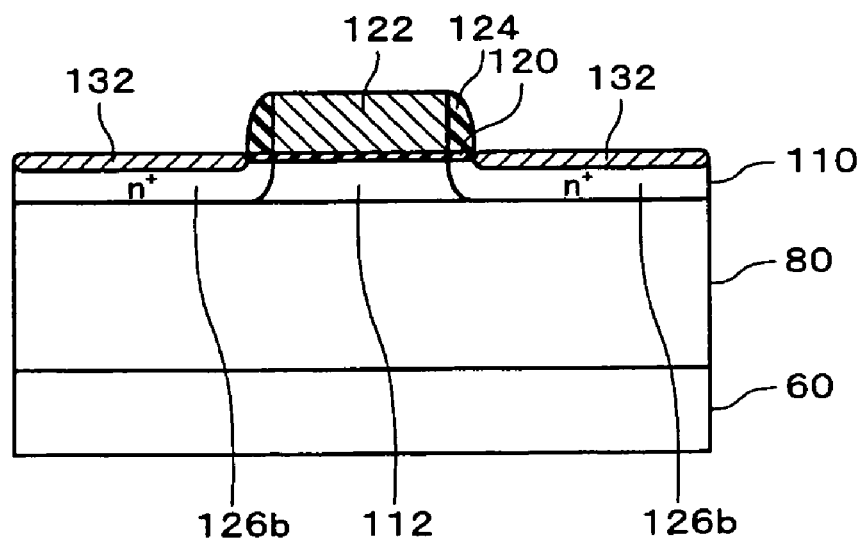

SILICIDED BODY CONTACT SOI DEVICE

RELATED APPLICATIONS

This application claims priority to Japanese Patent Application No. 2004-082544 filed Mar. 22, 2004 which is hereby expressly incorporated by reference herein in its entirety.

BACKGROUND

1. Technical Field

The present invention relates to semiconductor devices having a so-called source-body-tie structure in which a body region and a source region are connected to each other, and methods for manufacturing the same.

2. Related Art

Research and development are being made in recent years on insulated gate type transistors which are provided in a semiconductor layer (SOI layer: Silicon On Insulator layer) provided on a dielectric layer as devices that can realize lower power consumption and high-speed operation, compared to the case where transistors are formed in a semiconductor layer in a bulk state. Among insulated gate type field effect transistors provided in such a SOI layer, there are those having a source-body-tie structure in which a source region and a body region are connected to each other. FIG. 8 shows a plan view of a semiconductor device including a MOS transistor having an exemplary conventional source-body-tie structure, FIG. 9(A) shows a cross-sectional view taken along lines A—A in FIG. 8, and FIG. 9(B) shows a cross-sectional view taken along lines B—B in FIG. 8. As an example of a conventional semiconductor device, a device having an n-channel type MOS transistor provided on a SOI layer is indicated. The exemplary conventional semiconductor device includes a gate dielectric layer 120 provided on a semiconductor layer 110 and a gate electrode 122. A source region 126a and a drain region 126b which are composed of n-type high concentration impurity regions are provided in the semiconductor layer 110. Further, the source region 126a is divided by a body contact region 130 into plural areas. The body contact region 130 is composed of a p-type impurity region, and is provided in a manner to connect to a body region 112.

The source region 126a and the drain region 126b are provided with contact sections 140, respectively. Holes that are generated by impact ionization below the gate electrode 122 would be absorbed by the contact sections 140 through the body contact region 130. In a MOS transistor having a source-body-tie structure, holes generated by impact ionization can be absorbed in this manner, and therefore a semiconductor device having a reduced substrate floating effect can be provided.

In the exemplary conventional semiconductor device described above, impact ions generated below the gate electrode 122 are absorbed by the contact sections 140 through the body region 112 and the body contact region 130. In other words, holes generated by impact ionization are absorbed after moving a long distance, and therefore the effects of a source-body-tie structure may not be sufficiently attained under the recent demands for high-speed switching characteristics.

It is an object of the present invention to provide a semiconductor device including a MOS transistor having a source-body-tie structure that can effectively absorb holes generated by the impact ionization phenomenon, and a method for manufacturing the same.

SUMMARY

A semiconductor device includes: a dielectric layer; a semiconductor layer provided above the dielectric layer; a gate dielectric layer provided above the semiconductor layer; a gate electrode provided above the gate dielectric layer; a source region and a drain region provided in the semiconductor layer; a body region other than the source region and the drain region in the semiconductor layer; and a body contact region that divides the source region in a plurality of areas and joins to the body region, wherein the body contact region is formed of a compound of semiconductor of the semiconductor layer and a metal.

In the semiconductor device of the present invention, the body region and the body contact region are connected through a Schottky junction. Accordingly, when a MOS transistor is operated, holes generated by the impact ionization phenomenon do not travel to a contact section, but can be directly absorbed by the body contact region. As a result, there is provided a semiconductor device having excellent characteristics in which holes generated in the body region can be excellently absorbed, and the substrate floating effect is reduced even when a high voltage is applied.

It is noted that, in the present invention, providing "a layer B above a specified layer A" includes a case where the layer B is provided directly on the layer A, and a case where the layer B is provided over the layer A through another layer.

In the semiconductor device in accordance with the present invention, the body contact region can be formed of a silicide compound. According to this embodiment, a semiconductor device having a body contact region formed by a simpler process can be provided.

In the semiconductor device in accordance with the present invention, the body region and the body contact region may be connected through a Schottky junction.

In the semiconductor device a in accordance with the present invention, a silicide layer may be provided at least on the source region, and the source region and the silicide layer may be connected through an ohmic junction.

The semiconductor device in accordance with the present invention may further include a contact section provided in a manner to contact the source region and the body contact region.

A method for manufacturing a semiconductor device in accordance with the present invention includes the steps of: (a) forming a gate dielectric layer above a semiconductor layer provided on a dielectric layer; (b) forming a gate electrode above the gate dielectric layer; (c) forming a source region and a drain region by introducing impurities in the semiconductor layer after forming a mask layer that covers a specified region of the semiconductor layer; and (d) forming a silicide layer in the region that has been covered by the mask layer, thereby forming a body contact region that divides the source region.

According to the method for manufacturing a semiconductor device in accordance with the present invention, after a mask layer to cover a region where a body contact region is to be formed in a later step has been formed, a source region and a drain region are formed. Then, a silicide layer is formed in a region that has been covered by the mask layer, such that a body contact region is formed in a manner to divide the source region. By this, a semiconductor device having a body region and a body contact region that are connected through a Schottky junction can be provided.

In the method for manufacturing a semiconductor device in accordance with the present invention, the step (c) can include forming another silicide layer on the source region and the drain region after the source region and the drain region have been formed. According to this embodiment, another silicide layer different from the silicide layer composing the body contact region can be formed above the source region and the drain region.

In the method for manufacturing a semiconductor device in accordance with the present invention, the step (d) can be conducted after forming another mask layer that covers an area other than a region where the body contact region is formed. According to this embodiment, a silicide layer composing the body contact region and a silicide layer formed above the source region and the drain region can be formed independently from each other.

BRIEF DESCRIPTION OF THE DRAWINGS

FIG. 9(A) is a cross-sectional view taken along lines A—A of FIG. 8, and (B) is a cross-sectional view taken along lines B—B of FIG. 8.

DETAILED DESCRIPTION

An example of an embodiment of the present invention is described below.

Semiconductor Device

Figure 1:
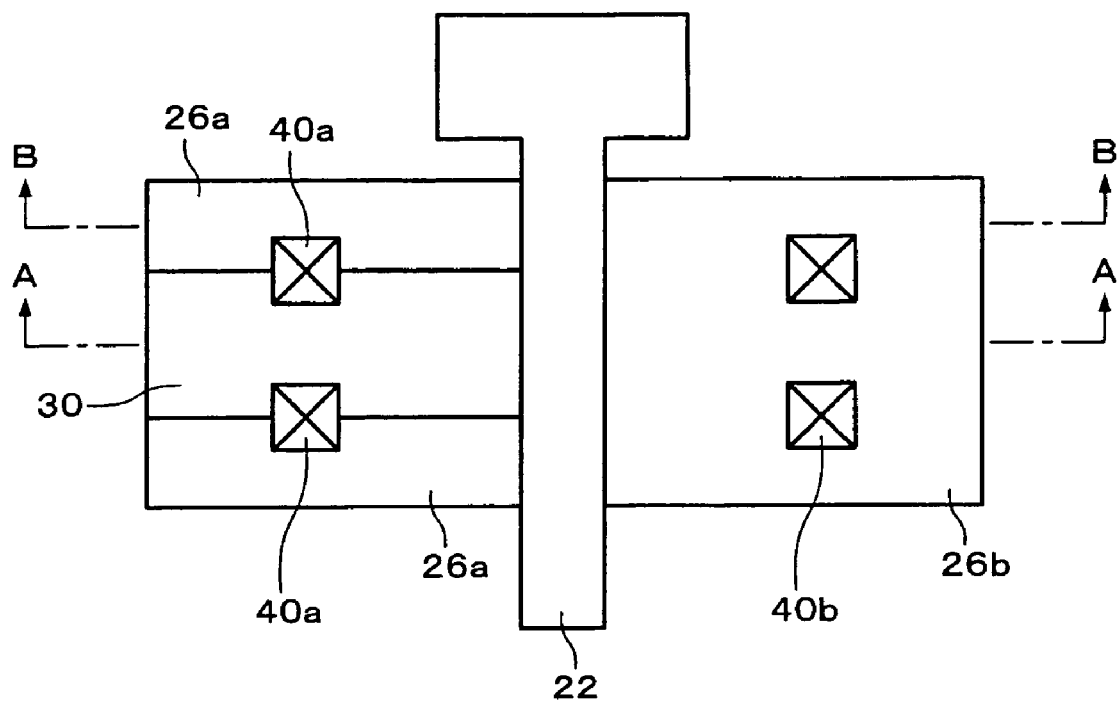
FIG. 1 is a plan view schematically showing a semiconductor device in accordance with an embodiment of the present invention.
Figure 2:
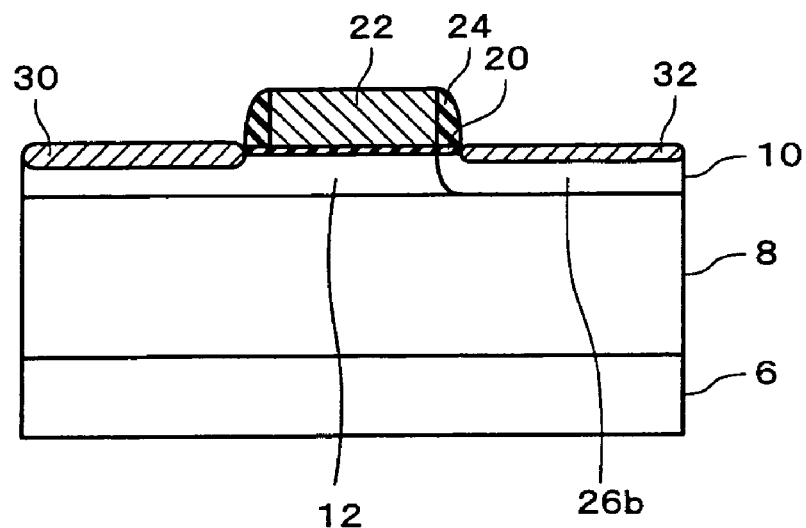
FIG. 2(A) is a cross-sectional view taken along lines A—A of FIG. 1, and (B) is a cross-sectional view taken along lines B—B of FIG. 1.
Figure 2:
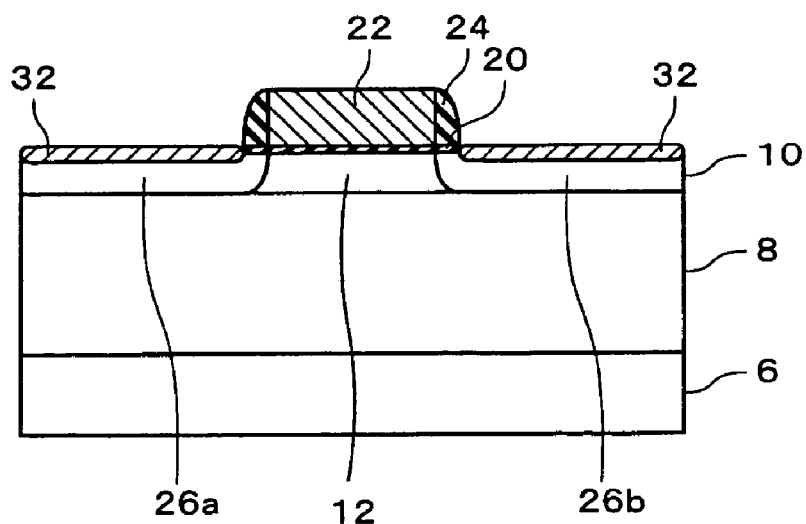

FIG. 1 is a plan view schematically showing a semiconductor device in accordance with an embodiment of the present invention. FIG. 2 (A) is a cross-sectional view taken along lines A—A of FIG. 1, and FIG. 2(B) is a cross-sectional view taken along lines B—B of FIG. 1.

A gate dielectric layer 20 and a gate electrode 22 are formed on a semiconductor layer 10. As shown in FIG. 1, a drain region 26b is provided in one area of semiconductor layer 10 and a source region 26a is provided in the other area of the semiconductor layer 10 across the gate electrode 22. Contact sections 40a and 40b are formed in the source and drain regions 26a and 26b for connecting to wirings to be provided in an upper layer (not shown). The source region 26a is divided by the body contact region 30. The body contact region 30 is composed of semiconductor of the semiconductor layer 10 and a metal, and is provided for connecting the body region 12 and the contact sections 40a. The compound of semiconductor and a metal composing the body contact region 30 can be a silicide, for example. In this case, the impurity concentration of the body region is set to be $10^{19}$ [cm$^{-3}$] or lower to adjust the threshold value of a semiconductor device (transistor), such that the body region 12 composed of semiconductor and the body contact region 30 composed of silicide have a Schottky contact.

Also, a silicide layer 32 is formed over the source region 26a and the drain region 26b. The silicide layer 32 is formed from a material having a work function different from that of a silicide layer that can compose the body contact region 30. More specifically, the silicide layer 32 is formed from a material that forms an ohmic contact with the source region 26a.

The contact section 40a provided in the source region 26b is provided in a manner to contact both of the source region 26b and the body contact region 30. With such an implementation, one contact section 40a can also serve to absorb holes from the body contact region 30.

Advantages of the semiconductor device in accordance with the present embodiment are as follows.

Figure 8:
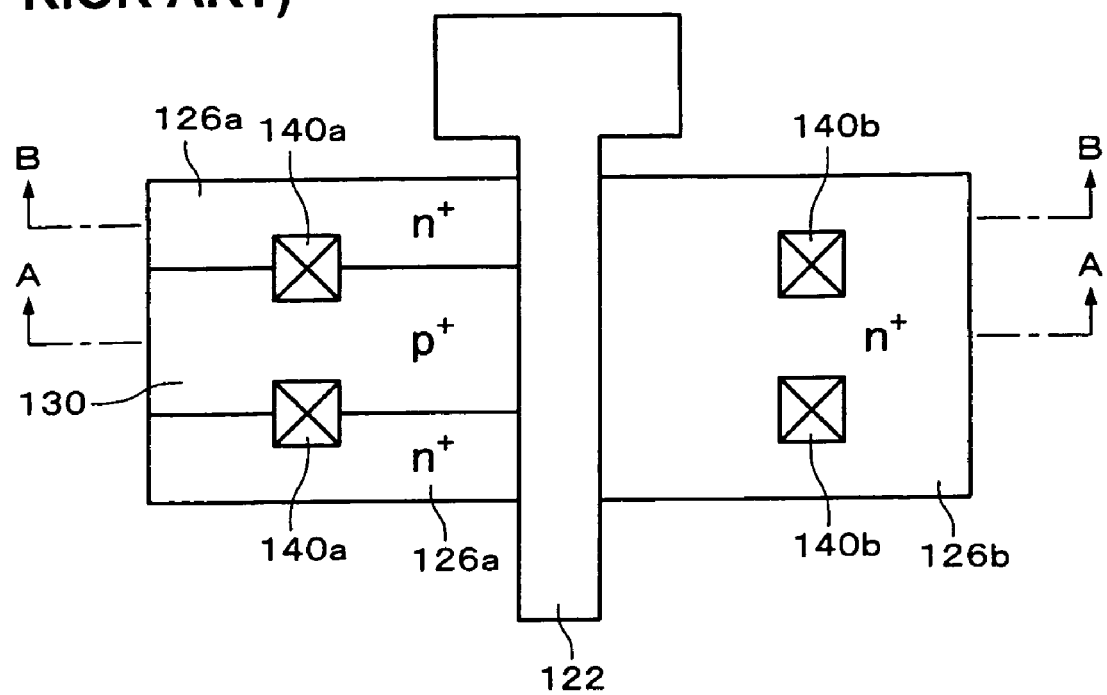
FIG. 8 is a plan view schematically showing a semiconductor device in accordance with a conventional example.
Figure 10:
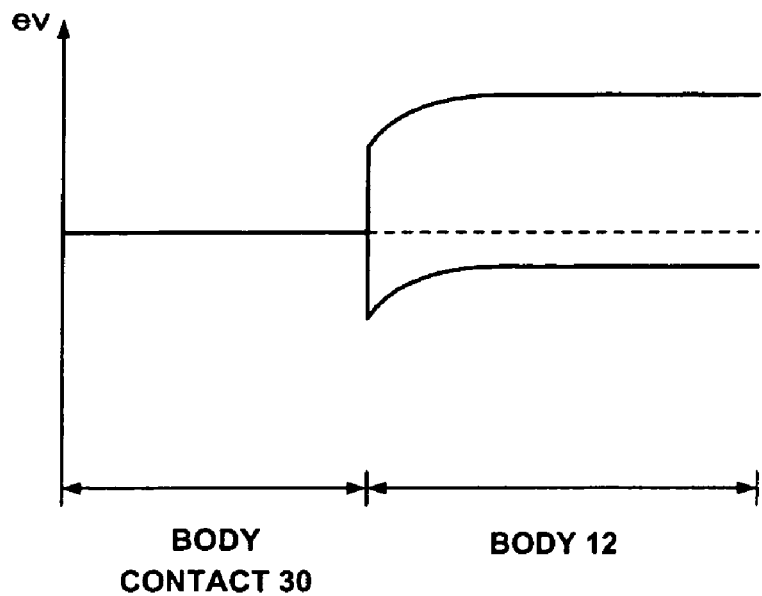
FIG. 10 shows energy band diagrams of a body region and a body contact region of a semiconductor device in accordance with an embodiment of the present invention.
Figure 10:
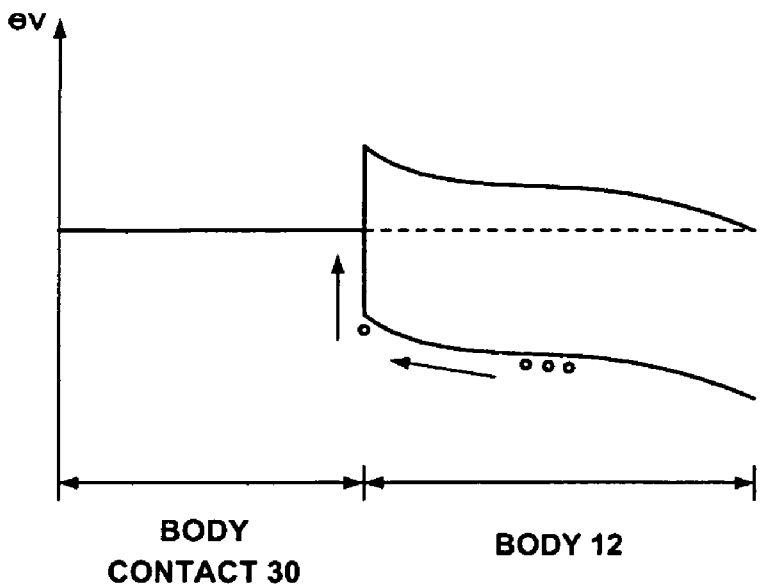
Figure 11:
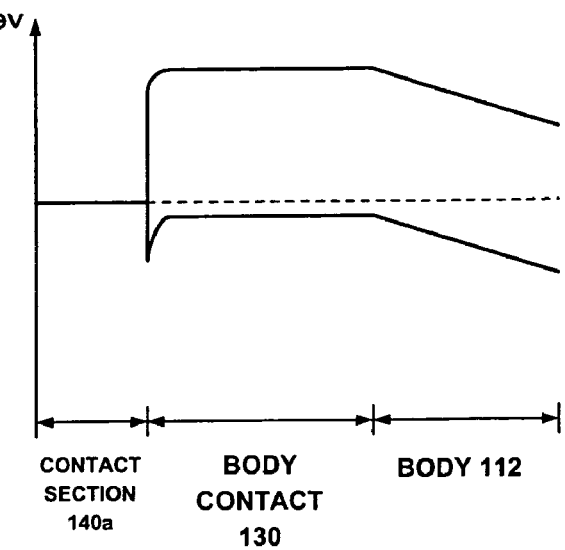
FIG. 11 shows an energy band diagram of a body region and a body contact region of a semiconductor device in accordance with a conventional example.

The semiconductor device in accordance with the present embodiment has a source-body-tie type transistor in which the body region 12 and the source region are connected, wherein the body contact region 30 is formed from a compound of semiconductor of the semiconductor layer 10 and a metal. To show advantages of the semiconductor device in accordance with the present embodiment compared to an example of a conventional semiconductor device, for example, n-channel type transistors are described with reference to FIGS. 10 and 11. FIG. 10 show energy band diagrams of the body region 12 and the body contact region 30 of the semiconductor device in accordance with the present embodiment, wherein (A) shows a state before a gate voltage is impressed, and (B) shows a state after a gate voltage is impressed. FIG. 11 shows an energy band diagram of the body region 112 and the body contact region 130 when the MOS transistor of the exemplary conventional semiconductor device shown in FIGS. 8 and 9 is operated. As shown in FIG. 11, in the semiconductor device of the conventional example, holes generated by impact ionization at a boundary between the drain region and the body region must travel through a long and gentle potential. For this reason, even when a source-body-tie structure is adopted for suppressing the substrate floating effect, a sufficiently high speed operation may not be secured depending on the voltage impressed to the drain region.

Next, the features of the semiconductor device in accordance with the present embodiment are described. As shown in FIG. 10(A), due to the fact that a Fermi level of a low concentration p-type impurity region of the body region 12 and a Fermi level of the silicide layer of the body contact region 30 are matched with each other such that a Schottky barrier is formed. When the transistor is operated, the energy band is modified as shown in FIG. 10(B) due to the influence of an electric field from the gate electrode 22. As a result, the barrier disappears, and holes generated by impact ionization can flow into the body contact region 30 that is formed from the silicide layer. In the semiconductor device in accordance with the present embodiment, by this phenomenon, holes generated by impact ionization can be excellently absorbed by the body contact region 30. As a result, it is possible to provide a semiconductor device that can suppress kink effects such as the substrate floating effect and achieve lower power consumption and higher speed operation properties. It is noted that the advantages described above are not limited to an n-channel type.

Method for Manufacturing Semiconductor Device

Next, a method for manufacturing a semiconductor device in accordance with an embodiment of the present invention is described with reference to FIGS. 3–7. In the manufacturing method described below, numerical values recited as embodiment examples indicate values when an n-channel type MOS transistor is formed. It is noted that figures (A) in FIGS. 5–7 indicate steps of manufacturing a section corresponding the section shown in FIG. 2(A), and figures (B) indicate steps of manufacturing a section corresponding to the section shown in FIG. 2(B).

Figure 3:
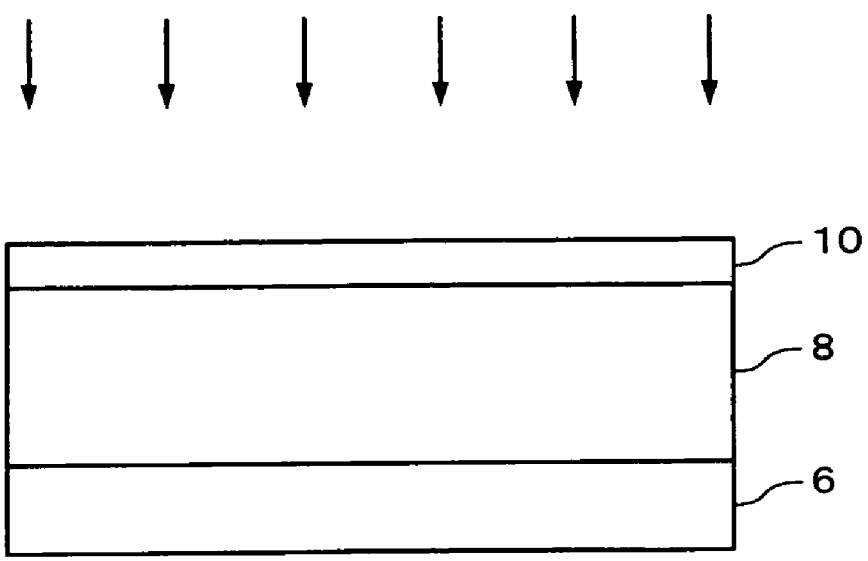
FIG. 3 is a plan view schematically showing a step of manufacturing a semiconductor device in accordance with an embodiment of the present invention.

(1) First, as shown in FIG. 3, a SOI substrate formed from a semiconductor layer 10 provided on a dielectric layer 8 on a support substrate 6 is prepared. As the SOI substrate, an example using a substrate on which the dielectric layer 8 and the semiconductor layer 10 are laminated on the support substrate 6 is described. However, without being limited to this example, a SIMOX (Separation by Implanted Oxygen) substrate, a laminated substrate or a laser anneal substrate can be used. As the semiconductor layer 10, for example, Si, Si—Ge, GaAs, InP, GaP, GaN, or the like can be used. Also, when the film thickness of the semiconductor layer 10 of the prepared SOI substrate is different from a desired film thickness, sacrificial oxidation, wet etching with hydrofluoric acid, or the like may be conducted to adjust the film thickness.

Then, as shown in FIG. 3, an impurity of a prescribed conductivity type is introduced into the semiconductor layer 10 for adjusting the threshold value. The impurity can be introduced by an ion implantation method. For example, when an n-channel type MOS transistor is formed by using a single crystal silicon layer having a film thickness of 50 nm as the semiconductor layer 10, $BF_2$ is used as the impurity, which may be implanted with the energy of 30 keV in the amount of about 1 through 5 $E^{12}/cm^2$.

Figure 4:
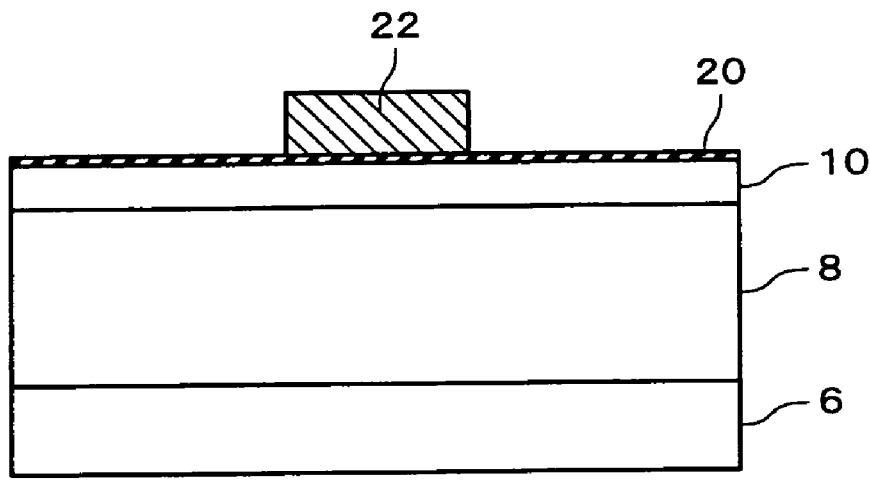
FIG. 4 is a plan view schematically showing a step of manufacturing a semiconductor device in accordance with the embodiment.
Figure 5:
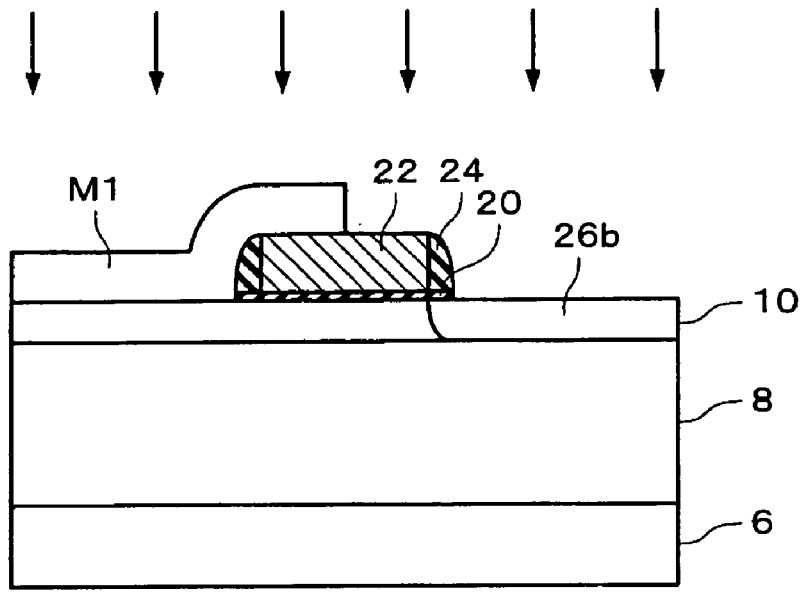
FIG. 5 shows plan views schematically showing a step of manufacturing a semiconductor device in accordance with the embodiment.
Figure 5:
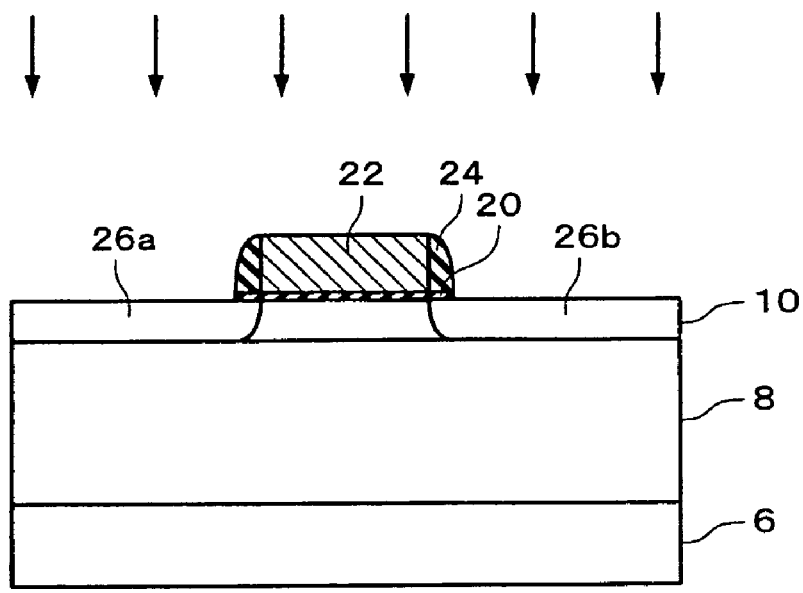
Figure 6:
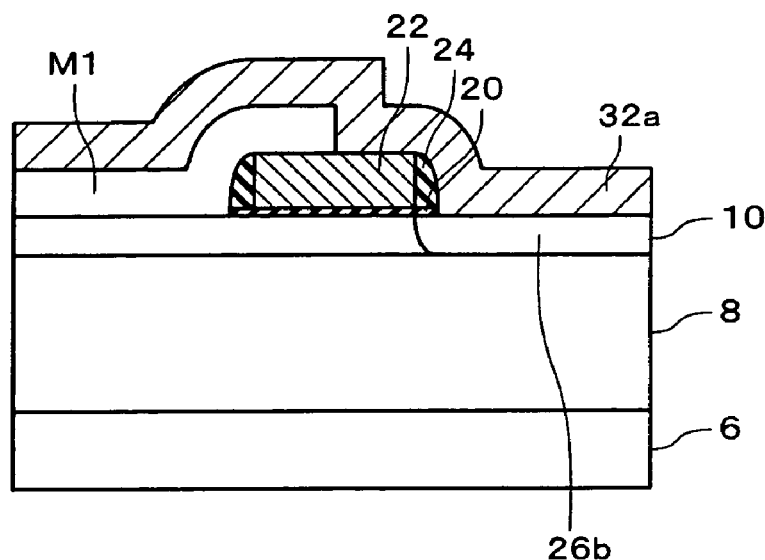
FIG. 6 shows plan views schematically showing a step of manufacturing a semiconductor device in accordance with the embodiment.
Figure 6:
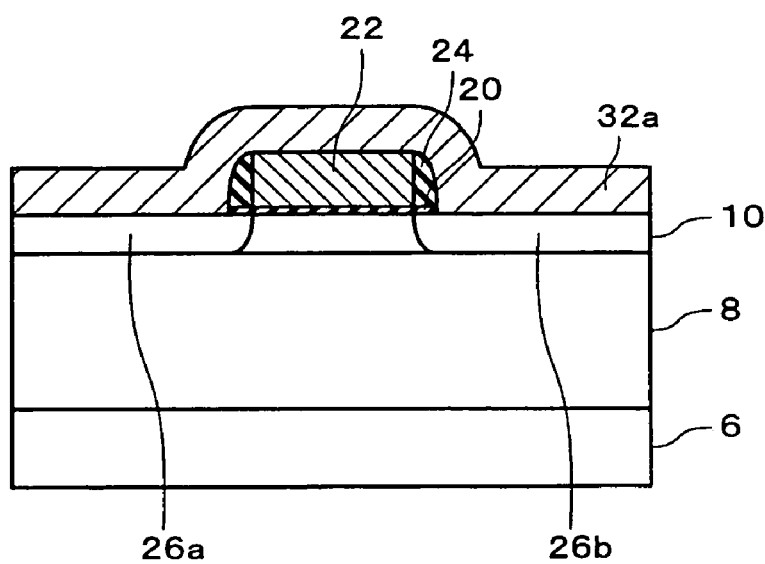

(2) Next, as shown in FIG. 4, a gate dielectric layer 20 and a gate electrode 22 are formed. The gate dielectric layer 20 can be formed from a silicon oxide film by a thermal oxidation method. Then, a conductive layer (not shown) for the gate electrode 22 is formed on the gate dielectric layer 20. As the conductive layer, for example a polycrystal silicon layer may be deposited to about 200 nm. Then, the conductive layer is patterned by known lithography and etching techniques, thereby forming the gate electrode 22.

(3) Next, as shown in FIGS. 5(A) and (B), sidewall insulation layers 24 are formed on side surfaces of the gate electrode 22. For example, the sidewall insulation layers 24 may be formed as follows. An insulation layer (not shown) is formed over the entire surface of the semiconductor layer 10. As the insulation layer, a silicon nitride film, a silicon oxide film, or a laminated film of these films can be used. Then, the insulation layer is anisotropically etched, whereby the sidewall insulation layers 24 can be formed on side surfaces of the gate electrode 22.

Then, as shown in FIG. 5(A), a protection film M1 is formed in a region where a body contact region is formed (see FIG. 1). At this time, the protection film M1 is not formed in a region where a source region is formed, as shown in FIG. 5(B). The protection film M1 can be formed through, for example, forming an insulation layer (not shown) such as a silicon oxide layer over the entire surface of the semiconductor layer 10, and patterning the insulation layer.

Then, to form source/drain regions 26a and 26b, an impurity of a prescribed conductive type is introduced in the semiconductor layer 10. For example, P may be used as the impurity, and implanted with the energy of 10 keV in the amount of about 2 $E^{15}/cm^2$. At this time, the impurity is not introduced in the region that is covered by the protection layer M1. Also, in this ion implantation, an angled ion implantation method may be used, such that the impurity can also be introduced in the semiconductor layer 10 that is covered by the sidewall insulation layers 24. Then, a heat treatment is conducted to activate the introduced impurity. The heat treatment can be conducted by, for example, a RTA method, at a treatment temperature of 1000° C., for a treatment time of 30 seconds.

(4) Next, a silicide layer 32 (see FIG. 2) is formed on the source region 26a and the drain region 26b. This step is described with reference to FIGS. 6(A) and (B). This step is conducted in a state in which the protection film M1 formed in the previous step (3) still remains. The silicide layer 32 can be formed, for example, as follows. First, as shown in FIGS. 6(A) and (B), a metal layer 32a for forming the silicide layer 32 is formed over the entire surface of the semiconductor layer 10. As the metal layer 32a, for example, Ti is deposited to about 20 nm by a sputter method. As the silicide layer 32, a material that ohmically contacts the source region 26a can be used. According to this embodiment, the body region 12 can have an impurity implanted in an amount just enough to be able to adjust the threshold value, and an impurity of high concentration does not need to be implanted in the body region 12. Also, the metal layer 32a may be formed of Ti, Co. Ni, Mo, Pt or Rb.

Figure 7:
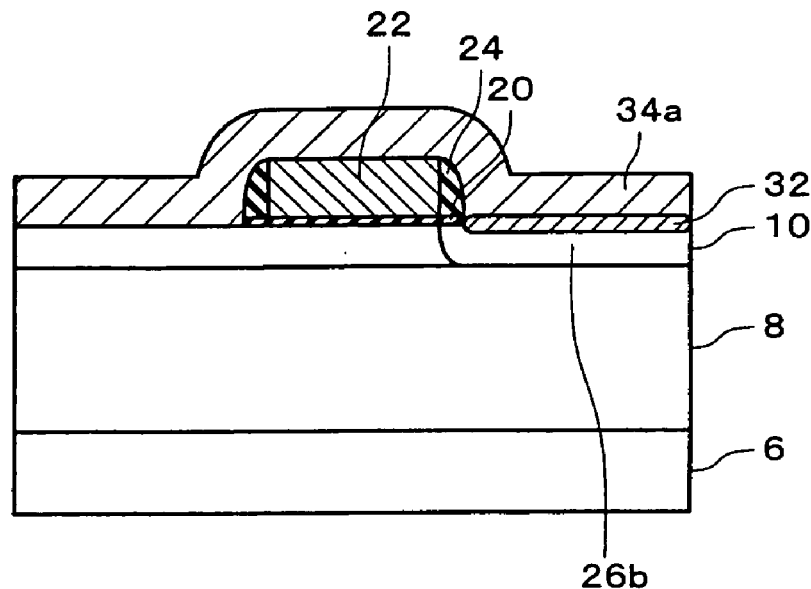
FIG. 7 shows plan views schematically showing a step of manufacturing a semiconductor device in accordance with the embodiment.
Figure 7:
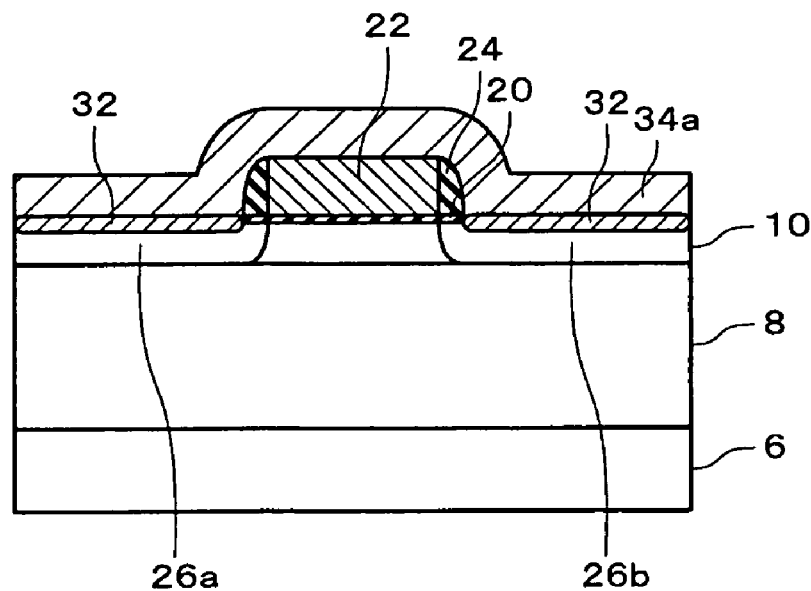

(5) Next, a first stage heat treatment is conducted, to cause a silicidation reaction between the metal layer 32a and the semiconductor layer 10. As a result, a silicide layer 32 is formed on the source region 26a and the drain region 26b, as shown in FIG. 7. This first stage heat treatment can be conducted by using, for example, a RTA method, under conditions with the treatment temperature of 600° C.–700° C. Then, unreacted portions of the metal layer 32a are removed. The removal of unreacted portions of the metal layer 32a can be conducted by wet etching with a mixed solution of $NH_4OH$, $H_2O_2$, and $H_2O$. Then, a second stage heat treatment is conducted, to thereby further stabilize the silicide layer 32, and form the silicide layer 32 with a low resistance. The second stage heat treatment can be conducted under conditions with a treatment temperature of 800° C. or higher. Then, the protection film M1 is removed. This step is conducted in a state in which the body contact region is covered by the protection film M1, such that the silicide layer 32 would not be formed.

Then, a body contact region 30 (see FIG. 2) is formed. The body contact region 30 is formed of a compound of a semiconductor of the semiconductor layer 10 and a metal. For example, a silicide layer can be used as the body contact region 30. In the present embodiment, a case where a silicide layer is formed is described. First, a metal layer 34a is formed over the entire surface of the semiconductor layer 10, as shown in FIG. 7. For example, as the metal layer 34a, Pt can be formed by a sputtered method. Then, a heat treatment is conducted to cause a silicidation reaction. The heat treatment to cause a silicidation may be conducted through heat-treating in two stages as described in the step (4) described above. Only a first stage heat treatment may be conducted depending on the material of the metal layer, if only the first stage heat treatment is sufficient. Then, unreacted portions of the metal layer 34a are removed. The removal of the metal layer 34a can be conducted in a similar manner as the method conducted in the step (4) described above. The compound composing the body contact region 30 may preferably be a material that can match with a Fermi level of the body region 12. More preferably, the compound may be a material that can be in a flat band state with the body region 12, when the MOS transistor is not operated.

Next, contact sections 40a and 40b (see FIG. 1) are formed on the source region 26a and the drain region 26b. The contact sections 40a and 40b are formed through forming a conductive layer and patterning the conductive layer. At this time, the contact sections 40a formed in the source region 26a are formed in a manner to come in contact with both of the source region 26a and the body contact region 30.

According to the method for manufacturing a semiconductor device in accordance with the present embodiment, after forming the protection layer (mask layer) M1 that covers an area where the body contact region 30 is formed, the source region 26a and the drain region 26b are formed. Then, the semiconductor of the semiconductor layer in the area that is covered by the protection layer M1 is silicidized, whereby the body contact region 30 is formed in a manner to divide the source region 26a. As a result, a semiconductor device having the body region 12 and the body contact region 30 that are connected through a Schottky junction can be manufactured. As a result, as described above, it is possible to manufacture a semiconductor device having a MOS transistor with a source-body-tie structure whose efficiency to absorb holes generated by the impact ionization phenomenon is improved.

Modification Example

Figure 12:
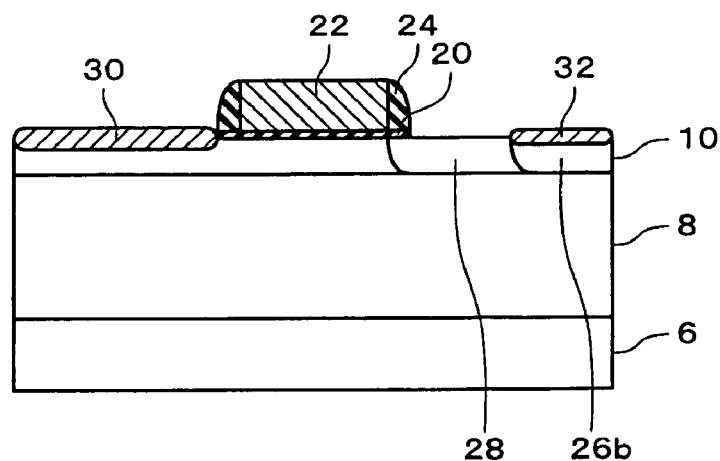
FIG. 12 is a cross-sectional view schematically showing a semiconductor device in accordance with a first modification example.
Figure 13:
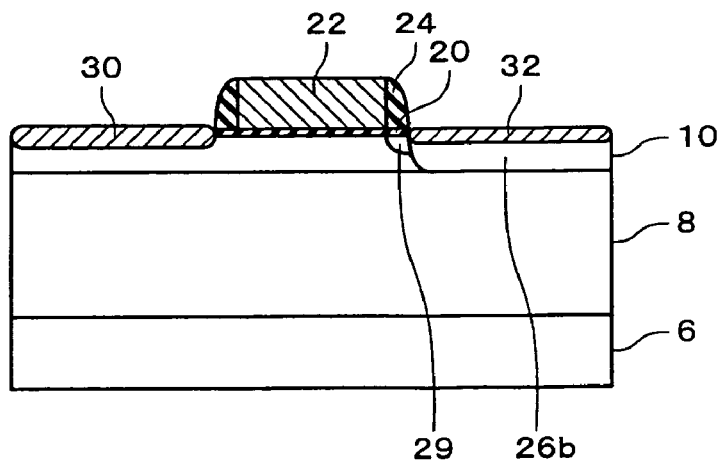
FIG. 13 is a cross-sectional view schematically showing a semiconductor device in accordance with a second modification example.
Figure 14:
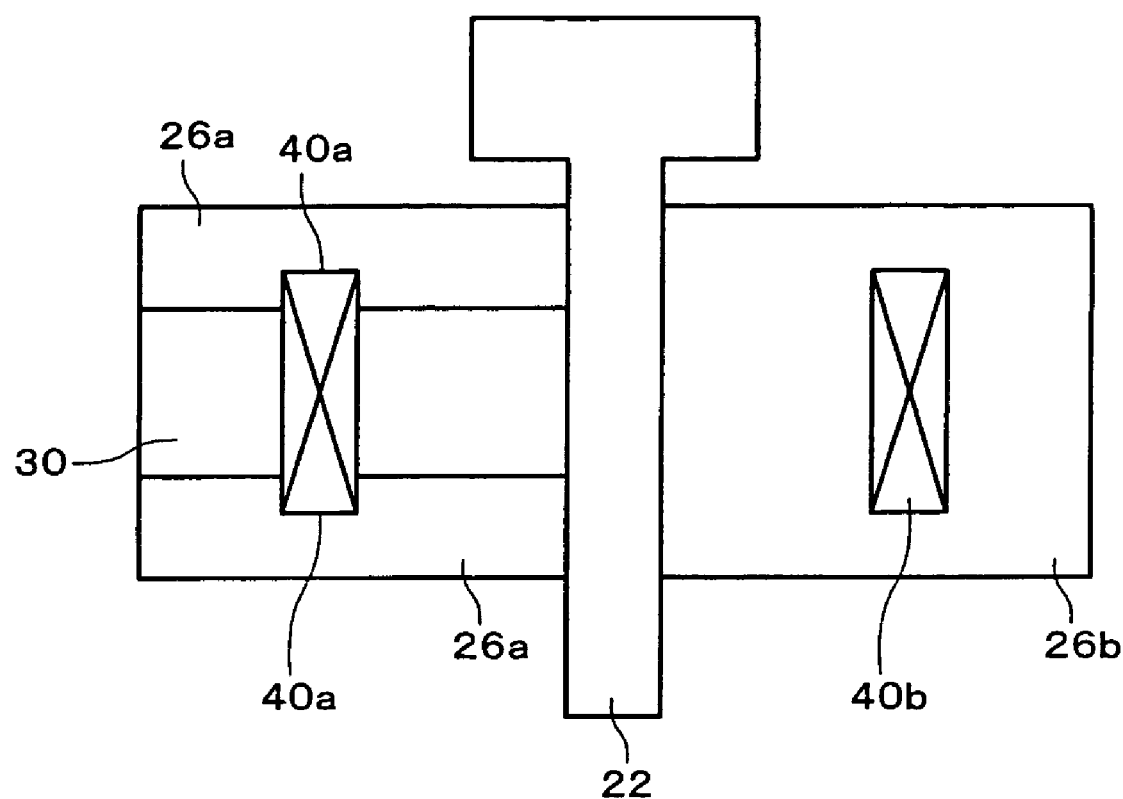
FIG. 14 is a plan view schematically showing a semiconductor device in accordance with a third modification example.

The present invention is not limited to the above-described embodiment, and can be modified within the scope of the subject matter of the present invention. As a modification example, for example, a semiconductor device shown in FIGS. 12–14 can be enumerated. FIG. 12 is a cross-sectional view schematically showing a semiconductor device in accordance with a first modification example. FIG. 13 is a cross-sectional view schematically showing a semiconductor device in accordance with a second modification example. FIG. 14 is a plan view schematically showing a semiconductor device in accordance with a third modification example. It is noted that the cross-sectional views in FIGS. 12 and 13 indicate the same sections as those shown in the cross-sectional view of FIG. 2(A).

As shown in FIG. 12, the semiconductor device in accordance with the first modification example can be provided with an LDD (lightly doped drain) region 28 between a drain region 26b and a channel region (a semiconductor layer 10 under a gate dielectric layer 20). In this embodiment, the electric field can be alleviated in a boundary section between the drain region 26b and a body region 12, such that generation of the impact ionization phenomenon can be suppressed. As a result, generation of holes that cause the substrate floating effect can be suppressed, and therefore a semiconductor device that achieves lower power consumption and high-speed operation properties can be provided. When the semiconductor device of the present example is manufactured, an impurity of a prescribed conductivity type is introduced before forming sidewall insulation layers 24 in the step (3) of the present embodiment described above.

The semiconductor device in accordance with the second modification example is different from the semiconductor device in accordance with the present embodiment in that an extension region 29 is formed between a drain region 26b and a channel region, as shown in FIG. 13. This embodiment has an advantage in that the short-channel effect can be suppressed. For this reason, a semiconductor device that is much smaller and is capable of high-speed operation can be provided. It is noted that, when the semiconductor device in accordance with the second modification example is manufactured, an impurity of a prescribed conductivity type is introduced before forming sidewall insulation layers 24 in the step (3) of the present embodiment described above.

A semiconductor device in accordance with a third modification example has a contact section 40a that is different from the semiconductor device in accordance with the present embodiment, as shown in FIG. 14. The contact section 40a may be in any shape without any particular limitation as long as it is in contact with both of a source region 26a and a body contact region 30. For example, as shown in FIG. 14, the contact section 40a may have a shape that extends across the body contact region 30.

What is claimed is:

1. A semiconductor device comprising:
a dielectric layer;
a semiconductor layer provided above the dielectric layer;
a gate dielectric layer provided above the semiconductor layer;
a gate electrode provided above the gate dielectric layer;
a source region and a drain region provided in the semiconductor layer;
a body region other than the source region and the drain region in the semiconductor layer;
a silicide layer that is provided at least on the source region; and
a body contact region that is formed of a compound of a semiconductor material of the semiconductor layer and a metal and joins to the body region,
the source region including a first source region and a second source region with a portion of the body region positioned between the first source region and the second source region,
wherein the body contact region is formed on the portion of the body region, and wherein the body contact region has a work function that is different from a work function of the silicide layer.

2. A semiconductor device according to claim 1, wherein the body contact region is formed of a silicide compound.

3. A semiconductor device according to claim 1, wherein the body region and the body contact region are connected through a Schottky junction.

4. A semiconductor device according to claim 1, wherein the source region and the silicide layer are connected through an ohmic junction.

5. A semiconductor device according to claim 1, further comprising a contact section provided to contact the source region and the body contact region.

6. A semiconductor device comprising:
a dielectric layer;
a semiconductor layer provided above the dielectric layer;
a gate dielectric layer provided above the semiconductor layer;

a gate electrode provided above the gate dielectric layer;

a source region and a drain region provided in the semiconductor layer, wherein the source region includes a first source region and a second source region;

a body region other than the source region and the drain region in the semiconductor layer, wherein a portion of the body region is located between the first source region and the second source region;

a silicide layer that is provided at least on the source region; and a body contact region that is formed of a compound of the semiconductor layer and a metal; that is located on said portion of the body region, and that has a work function different from a work function of the silicide layer, wherein a first metal layer forms the body contact region and a second metal layer forms the silicide layer.

* * * * *